United States Patent [19]

Boutros

[11] 4,187,481

[45] Feb. 5, 1980

[54] EMI FILTER CONNECTOR HAVING RF SUPPRESSION CHARACTERISTICS

[75] Inventor: Kamal S. Boutros, Downsview, Canada

[73] Assignee: Bunker Ramo Corporation, Oak Brook, Ill.

[21] Appl. No.: 863,642

[22] Filed: Dec. 23, 1977

[51] Int. Cl.[2] .................... H03H 17/04; H03H 13/00; H01R 17/10; H01R 17/12

[52] U.S. Cl. .................................... 333/182; 333/183; 333/184; 339/147 R

[58] Field of Search ...................... 333/70 R, 79, 70 S, 333/73 C, 97 R, 167, 181-184; 339/147 R, 143 R, 147 C, 14 R, 14 L, 14 P, 59 R, 59 M, 218 M; 361/302, 330

[56] References Cited

U.S. PATENT DOCUMENTS

| | | | |
|---|---|---|---|
| 3,289,118 | 11/1966 | Garstang | 333/182 |
| 3,320,557 | 5/1967 | Garstang | 333/182 |
| 3,535,676 | 10/1970 | Schultz, Sr. | 333/79 X |
| 3,538,464 | 11/1970 | Walsh | 333/182 |
| 3,539,973 | 11/1970 | Antes et al. | 339/143 |
| 3,573,677 | 4/1971 | Detar | 333/79 |
| 3,579,155 | 5/1971 | Tuchto | 333/79 |
| 3,721,869 | 3/1973 | Paoli | 333/79 X |
| 3,743,979 | 7/1973 | Schor | 333/79 |
| 3,870,978 | 3/1975 | Dreyer | 333/97 R |
| 3,879,102 | 4/1975 | Horak | 339/143 R |
| 3,961,294 | 6/1976 | Hollyday | 333/182 |

*Primary Examiner*—Alfred E. Smith
*Assistant Examiner*—Marvin Nussbaum
*Attorney, Agent, or Firm*—Frederick M. Arbuckle; William Lohff; Timothy Haller

[57] ABSTRACT

This disclosure relates to an EMI (Electro Magnetic Interference) filter connector which can be installed in the line between mating plugs and sockets normally used for terminating multiple conductors. This connector is used in an electronic equipment chassis or at a bulkhead junction box or, if necessary, between mating connectors in a cable run, where the metallic parts of the cable connector can be grounded. Conductive rubber or co-polymer elastometric washers are used to protect RF filter components in the connector from damage due to external stress. A high degree of EMI attenuation is provided by an integral metallic baffle having close fitting conductor holes which is located within the connector body.

6 Claims, 2 Drawing Figures

EMI FILTER CONNECTOR HAVING RF SUPPRESSION CHARACTERISTICS

BACKGROUND OF THE INVENTION

This invention relates generally to electrical connector assemblies and, more particularly, to bidirectional electromagnetic interference filter connector assemblies having high input/output attenuation and vice versa, over the frequency range of approximately 10 Mhz to 10 Ghz, and having very low external RF leakage, as well.

Electrical connectors having integral filter assemblies for attenuation of electrical interference are finding an increasing demand in the communication, data handling and aerospace industries. To meet this demand a wide variety of filter connector assemblies have been developed which utilized tubular ceramic capacitors, ferrite inductance ferrules and conductive elastomers of rubber or plastic. There features are used singly or in combination as a means of attenuating the transmission of undesired electromagnetic interference (EMI) through conductors terminated to the connectors by providing a low impedance path to ground for EMI. These filter assemblies also reduce EM radiation from a closed connector and lessen the susceptibility of a closed connector to pickup of externally generated EMI.

U.S. Pat. No. 3,579,155 describes a specially designed pin contact for use in a filtered EMI connector. This pin contact includes a row of closely coupled ferrite beads and a co-axial tubular ceramic capacitor with split inside metallic surfaces connected to opposite ends of the pin body by means of conductive elastic grommets. The single outer conductor of the capacitor has a shoulder which contacts a metal plate element for grounding purposes. The pin filter section of this prior art connector is installed between a front pin contact element and a rear element designed to retain a connecting wire with a crimp fitting. The metal shell which retains an apertured insulating plug body is in two pieces. In practice, it was observed that RF leakage occurred at the interface of the two sections or pieces. The reason for the conductive elastic supports for the ceramic capacitor of the above cited prior art patent is to protect it from stresses caused by slight pin misalignment and pin movement during connection and disconnection of the plug assembly.

U.S. Pat. No. 3,535,676 and U.S. Pat. No. 3,539,973 each describes an identical rectangular multi-pin chassis or bulkhead connector designed to accommodate filtered connector pin sockets or pin contacts. While these two patents differ in certain mechanical and design details, they both feature use of a deformable elastic, electrically conducting gasket placed between two sections of the dielectric apertured pin retaining body. The function of this elastic rubber or polymer conductive gasket is to ground the external conductor of the coaxial capacitors on the filtered connector pins. The holes in the conductive gasket are designed to make an interference fit with the filter pins. The resistivity of the gasket is designed to decrease when the connector is bolted together. Conductive laminates of foil or metal mesh are also mentioned as a means of reducing the series resistance in the ground lead of the filter pin capacitors and as a means of increasing pin to pin isolation. However, these residual gasket resistances are a source of parasitic coupling between pins which is very undesirable.

U.S. Pat. No. 3,721,869 describes a filter contact connector and a method of assembly using a resilient gasket. The filter element in this cited patent consists of a coaxial capacitor the external conductor of which is grounded by being pushed through a hole in an electrically conductive elastic insert which connects the capacitor body to the metallic outer shell of the connector. The conductive elastic insert is clamped between two halves of a dielectric pin socket retaining body which allows some clearance around each pin socket to facilitate alignment with a mating pin. The desired resilience is provided by the conductive elastic insert which grips the inserted pins. This disclosed prior art device does not utilize a decoupling element and the resistance of the conductive gasket can cause undesired parasitic coupling between pins.

U.S. Pat. No. 3,870,978 describes a connector using electrically conductive resilient material compressed between abutting electrical contacts for use where thermal expansion or contraction may cause a connection problem. This overcomes looseness or misalignment problems. Also disclosed is the placement of a ceramic capacitor between two compressed conductive resilient contact blocks in series with abutting contact pins within a connector to perform a D.C. isolation function in an RF line. The thermal resistance of the conductive resilient contact blocks will potentially cause heat dissipation problems under high current conditions.

U.S. Pat. No. 3,879,102 describes a coaxial cable connector which features an internal sleeve that supports a comparatively thin-walled rigid outer conductor. An internally threaded metal compression fitting clamps the outer conductor to the cable connector, which is in turn bolted to a bulkhead or chassis. The above mentioned compression fitting cooperates on its outer end with a rubber "O" ring which functions to make the fitting water and gas tight. The disclosure indicates that while the metal to metal contact at the inner end of the compression fitting usually provides adequate RF shielding, additional reduction of RF leakage may be obtained by using an electrically conductive "O" ring.

While filter connectors such as those disclosed in these prior art patents have met with considerable success, they nevertheless suffer from the disadvantages mentioned and are not suitable for certain applications where both EMI suppression and control of RF leakage are important. Accordingly, a need exists for an EMI filter connector assembly which is capable of providing a high degree of EMI attenuation, be free of RF leakage and be able to provide physical stress isolation between its contacts and the RF filter assembly. In addition, a need exists for such a connector which is also compatible with existing chassis and bulkhead connectors and may be retrofitted without expensive rewiring.

SUMMARY OF THE INVENTION

Accordingly, the present invention is directed to an provided electrical connector capable of attenuating both electromagnetic and radio frequency interference. The connector generally comprises an electrically conductive shell including an integral ground plate, at least one electrical contact with an associated filter assembly and two electrically insulative inserts which support the contact and filter assembly within the shell. The contact extends through an aperture in the ground plate and outwardly beyond each insert while the filter assembly is completely housed within the inserts. Electrically conductive elastomeric grommets isolate the filter assembly from both the ground plate and the inserts, while at the same time completely sealing the filter connector from RF leakage.

Therefore, one feature of the invention is the provision of an EMI filter connector having an improved RF seal and stress isolated contacts.

Another feature of the invention is to increase the attenuation of broad band electromagnetic interference and radio frequency transmission through a filter connector in either direction.

A further feature of the invention is to provide an improved EMI filter connector which uses shunt capacitors of at least 4500 pf.

A still further feature of the invention to provide an improved EMI filter connector network having a Pi configuration.

BRIEF DESCRIPTION OF THE DRAWING

The novel features which are believed to be characteristic of the invention are set forth in the appended claims. The invention itself, however, together with further objects and attendant advantages thereof, will be best understood by reference to the following description taken in connection with the accompanying drawing, in which:

DETAILED DESCRIPTION OF THE PREFERRED EMBODIMENT

In accordance with a preferred embodiment of the invention, an EMI filter assembly is provided which includes an outer shell preferably of metal. Electrical contacts extend axially through the inner portion of the casing for transmission of the power or electrical signals. Ferrite inductance means are located on the contacts to provide a series inductance for the EMI filter assembly. Preferably, the inductance means are ferrite sleeves mounted coaxially over the contacts. Capacitor means are disposed over the ferrite cylinder for providing a shunt capacitance at each end thereof. The capacitor means are, preferably, cylindrical ceramic capacitors having plated or painted metalized portions forming the two capacitor electrodes. An apertured ground plate is formed integrally with and across the interior of the shell to provide an EMI filter ground and a heat dissipating casing support for the EMI filter assembly. The contacts extend through the ground plate but are spaced from the plate as described in greater detail below. Dielectric inserts together with elastomeric conductive grommets provide support for each of the contacts and filter assemblies within the connector.

Figure 1:
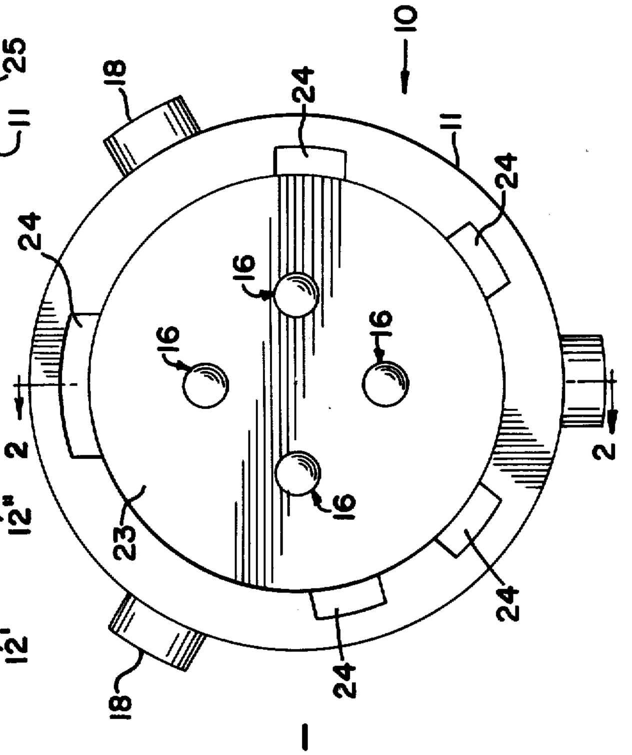
FIG. 1 is a front end view of the EMI filter connector of the present invention showing, in this embodiment, a four pin contact configuration spaced at 90 degree intervals, with three locking bayonet lugs on the external shell spaced at 120 degree intervals.

Referring now to FIG. 1, an end view is shown of an EMI filter connector generally designated by reference numeral 10. The EMI filter connector 10 comprises a metallic plug shell 11 which has external bayonet coupling lugs 18 including alignment grooves 24 which engage with matching splines (not shown) on a compatible connector component to be mated with the EMI filter connector 10.

Figure 2:
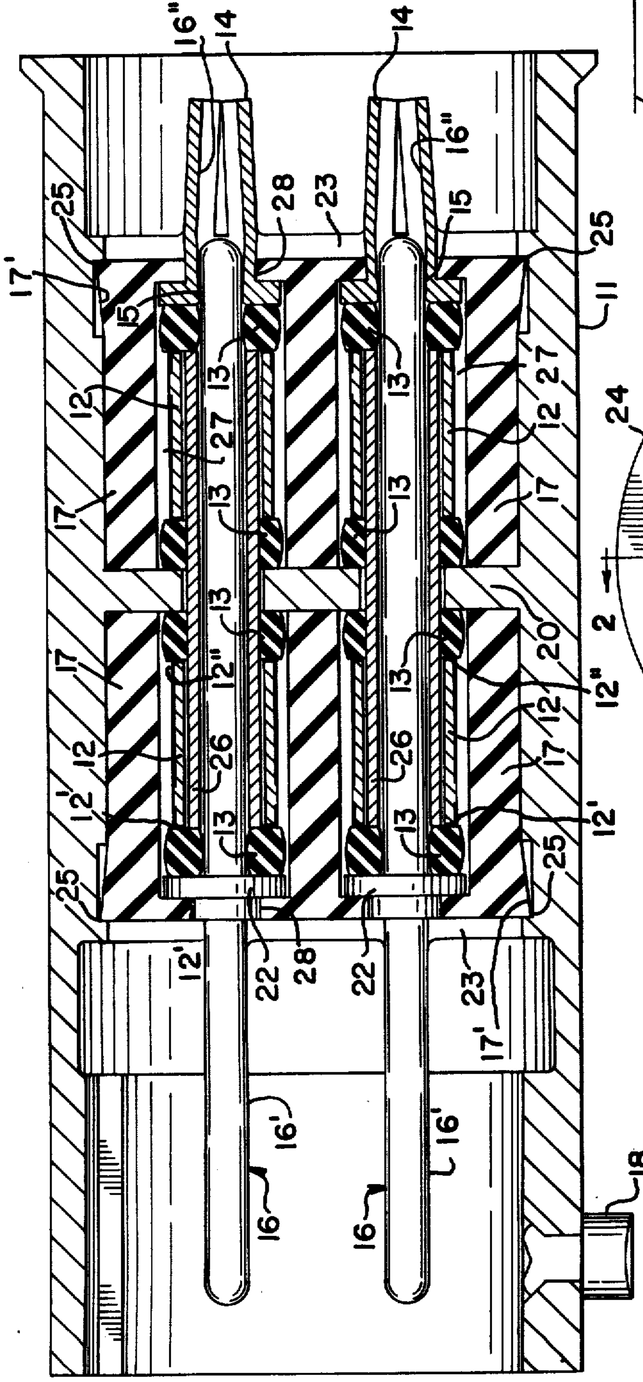
FIG. 2 is a cross-sectional view taken along line 2—2 of FIG. 1, of the EMI filter connector showing in greater detail the contacts and filter elements and their relationship with the connector shell and inserts.

A cross-sectional view of the EMI filter connector 10 is shown in FIG. 2. The metallic plug shell 11 may be fabricated by die casting and machine finished or, alternatively, machined from round metal bar stock. A thick metal baffle or ground plate 20 is an integral part of the metal plug shell 11. The plate 20 is an important feature of the invention because it contributes to the high attenuation of EMI passing through the filter connector 10 while providing excellent heat dissipation as well. The plate 20 has a plurality of apertures accommodating contact struts 16 and their associated filter assemblies.

Double shouldered flange elements 22 are located on each of the contact struts 16. The elements 22 may be separate bushings pressed onto each of the struts 16 or may be formed integrally therewith depending on the desired method of fabrication. Strut capping members 14 are also provided to engage the contact struts 16 in press fit relationship at the end 15. The struts 16 have an outwardly extending active contact element 16', here shown to be a pin contact, while the capping members terminate in an active contact element, as well, the illustrated capping members having sockets 16" with integral tines.

The filter assembly used in conjunction with each contact of the connector includes an inductance means, capacitor means and supporting elastomeric and electrically conductive grommets. The inductance means comprises a ferrite ferrule 26 which is mounted coaxially over the contact strut 16 and extends through the aperture of the ground plate 20. Disposed over the inductance means on opposite sides of the plate 20 are ceramic capacitor cylinders 12 having pin and ground electrodes, 12' and 12" respectively. The specific construction of both the ferrite ferrules 26 and the capacitor cylinders 13 is entirely conventional and well known to those skilled in the art. Electrically conductive grommets 13 are employed to provide a ground path to plate 20 and isolate the filter components from stresses transmitted to the connector assembly via the contacts.

Cylindrical dielectric inserts 17, which may be injection-moulded plastic with desirable electrical and mechanical characteristics, are used to support the contacts 16 together with their associated coaxial filter assemblies. Two identically configured cylindrical dielectric inserts 17 are required, one on each side of the plate 20, each retained in place by deforming the radially extending shoulder 17' to snap into grooves 25 in the metal plug shell 11. The inserts each include contact and filter retaining cavities 27 which have a length sufficient to house the filter assembly, while keeping the grommets 13 in axial compression. On the other hand, the transverse dimension of the cavities 27 is sufficiently great to preclude any radial compression of the grommets 13. Finally, the cavities 27 terminate at their outside ends in apertures 28 of reduced diameter which support the contact strut 16 and capping member 14. The apertures 28 are positioned to align the contact strut 16 and ferrite ferrule 26 within a given plate aperture but spaced from the walls of the aperture. This is necessary, of course, to insure the stress isolation of the filter assembly. Moisture and dust are excluded from the interior of the EMI filter connector assembly 10 by application of a layer of potting compound 23 to the completed connector.

The EMI filter connector 10 is easily and expeditiously assembled. A conductive grommet 13 is placed against the double shouldered flange element 22 on each of the contact struts 16. These grommets 13 are of flexible and resilient material (preferably a rubber or a rubber like elastomer with known compression, temperature and ageing characteristics), and contains conductive material to assure a low and predictable resistance when installed under pressure. A loosely fitting ferrite sleeve 26 is then assembled over each of the struts 16. This sleeve 26 is preferably made of a composite or mixed ferrite material with useful permeability to permit effective filtering at, for example, 8 or 9 Ghz. This ferrite material should also have a volume restivity of at least $10^6$ ohms/centimeter$^3$ in order to assure that the resistance of each of the struts 16 to ground will be uniformly high. A multi-layer ceramic coaxial capacitor is next installed on each of the struts 16, the metal plated ends of each of the capacitors 12 contacting the conductive grommets 13. Another grommet 13 is slipped over the ferrite sleeve 26 up to the ground end of the first ceramic capacitor 12. It is this grommet 13 that contacts the ground end of the first capacitor 12. The assembly of the contact struts 16 with their long ferrite sleeves 26 are now slipped through the apertures in the plate 20 (going from left to right in FIG. 2). The front ceramic capacitors 12 and the front grommets 13 which were mounted on the struts 16 are now installed in the front (left side portion of FIG. 2) half of the connector assembly 10.

Still another grommet 13 is slipped over the rear half (right side portion of FIG. 2) of the ferrite sleeves 26 (from the right end of the connector assembly 10) to contact the plate 20. The other ceramic capacitor 12 is then installed with the outer plating or ground end oriented toward the center plate 20. The last grommet 13 is now inserted and the capping member 14 is pressed into place around the end of each of the struts 16 in such a way as to properly compress each of the four grommets 13. Assembly of the filter connector 10 is completed by pressing the two dielectric inserts 17 into the grooves 25 in the shell 11 and then installing the previously mentioned potting compound 23 at each end of the connector assembly 10.

The grommets 13 in contact with the center plate 20 will absorb most of the thrust pressure when the pins 16 are engaged in a mating connector. Similarly, the center plate 20 and the grommets will also absorb most of the thrust when the connector assembly 10 is withdrawn from engagement with a mating connector. The ferrite sleeves 26 and the coaxial capacitors 12 are held captive by the grommets 13, which provide physical stress isolation for the fragile ceramic capacitors 13 and the ferrite sleeves 26.

The action of an EMI filter network provided by the ferrite sleeve 26 (which functions as an inductor) and the two capacitors 12 provide a Pi configuration based on the fact that an inductance represents a low impedance at low frequencies and a high impedance at high frequencies, whereas the opposite conditions occur with capacitances. When an inductance is connected in series with a line and capacitors are connected in shunt for use in a Pi network then direct current will flow with only a resistive drop, and alternative currents are subject to only a small series impedance. As the frequency increases, the series impedance increases and the shunt impedance decreases, thus with some simplification, it can be said that the Pi networks in the connector are low pass filters.

The center ground plate 20 provides a low ground resistance and also functions to permit heat dissipation, thereby enabling the contact struts 16 to carry a RF grounding current as high as about 5 amperes. Additionally, the center metal ground plate 20 provides rigidity and strengthens the plug shell 11.

While the invention has been particularly described in reference to the preferred embodiment thereof, it will be understood by those skilled in the art that changes in the form and details may be made without departing from the spirit and scope of the invention. For example, this disclosure shows a four pin connector, however, any number of pins may be used and in any configuration or size which may be desired to mate with other plug and socket designs.

I claim:

1. An electrical connector assembly capable of attenuating electromagnetic and radio frequency interference comprising:
   an electrically conductive shell including a generally transverse ground plate formed integrally therewith;
   at least one elongated electrical contact member extending longitudinally within said shell and through an aperture in said ground plate;
   a filter assembly associated with said contact member including means mounted coaxially over said contact member and also extending through said aperture for providing a series inductance for said filter assembly, capacitor means mounted coaxially over said inductance means on opposite sides of said ground plate, and electrically conductive first elastomeric grommet means disposed at opposite ends of said filter assembly and second elastomeric grommet means interposed between said capactor means and said ground plate; and
   two dielectric inserts, each retained within said shell on an opposite side of said ground plate and including at least one cavity for receiving and supporting said contact member and its associated filter assembly, said insert cavity having a length such that said grommet means are axially compressed to resiliently support said filter assembly.

2. The electrical connector assembly of claim 1 wherein said inductance means comprises a unitary ferrite sleeve and said capacitor means comprises a pair of ceramic sleeves, one ceramic sleeve mounted on each side of said ground plate.

3. The electrical connector assembly of claim 1 wherein said inserts are identically configured resilient bodies and include radially extending shoulders which engage annular recesses on the interior of said shell to lock said electrical connector in finally assembled relation.

4. The electrical connector assembly of claim 3 wherein said contact member includes an elongated strut and a strut capping member, said strut having a first active contact element at one end extending outwardly beyond said insert on one side of said ground plate, and said strut capping member having a central bore for receiving and electrically engaging the other end of said strut and a second active contact element extending outwardly beyond said insert on the other side of said ground plate.

5. The electrical connector of claim 3 wherein said insert cavities have a transverse dimension sufficient to prevent radial compression of said conductive grommets.

6. The electrical connector assembly of claim 1 wherein each said cavity terminates at the outer end of said insert in an aperture of reduced diameter, the insert apertures supporting said contact and inductance means spaced from said ground plate within said plate aperture.

* * * * *